United States Patent [19]

Kimpel

[11] Patent Number: 4,713,727

[45] Date of Patent: Dec. 15, 1987

[54] ELECTROMECHANICAL COMPONENT WITH SEALED HOUSING

[75] Inventor: Rolf D. Kimpel, Berlin, Fed. Rep. of Germany

[73] Assignee: Siemens Aktiengesellschaft, Berlin and Munich, Fed. Rep. of Germany

[21] Appl. No.: 920,721

[22] Filed: Oct. 20, 1986

[30] Foreign Application Priority Data

Oct. 30, 1985 [DE] Fed. Rep. of Germany ....... 3538621

[51] Int. Cl.[4] .................................... H05K 5/03

[52] U.S. Cl. ........................ 361/334; 174/52 PE; 335/202; 336/90; 361/424

[58] Field of Search ............ 174/52 PE, 52 S, 35 MS, 174/35 R; 336/90; 335/202; 361/331, 334, 335, 380, 417, 419, 420, 398, 424, 356, 357

[56] References Cited

U.S. PATENT DOCUMENTS

| | | | |
|---|---|---|---|
| 3,378,626 | 4/1968 | Tucker | 174/35 MS |
| 3,756,399 | 9/1973 | Cosier et al. | |
| 4,480,243 | 10/1984 | Minks | 335/202 |
| 4,509,098 | 4/1985 | Dasgupta | 361/398 |
| 4,517,537 | 5/1985 | Weiser et al. | |
| 4,554,522 | 11/1985 | Minks | 174/525 |

FOREIGN PATENT DOCUMENTS

| | | |
|---|---|---|
| 2520169 | 11/1976 | Fed. Rep. of Germany . |
| 2535173 | 2/1977 | Fed. Rep. of Germany . |
| 2901077 | 7/1980 | Fed. Rep. of Germany . |
| 3318581 | 11/1984 | Fed. Rep. of Germany . |

*Primary Examiner*—G. P. Tolin
*Attorney, Agent, or Firm*—Hill, Van Santen, Steadman & Simpson

[57] ABSTRACT

The component comprises a base body which has the contours of a cuboid housing. For the purpose of sealing, a foil is placed over the open lateral faces of the base body, whereby individual function chambers are separated from one another by corresponding seating surfaces of the housing and the foil. In this way, for example, the coil chamber can be filled with casting compound without having this casting compound run into the switch chamber. The foil thus eliminates an additional housing which would require more work steps and a higher volume of space to be occupied by the component.

8 Claims, 5 Drawing Figures

ELECTROMECHANICAL COMPONENT WITH SEALED HOUSING

BACKGROUND OF THE INVENTION

1. Field of the Invention

The invention relates to an electromechanical component, particularly a relay, having a base body comprising at least one switch chamber containing movable parts and at least one further mounting chamber containing stationary parts and filled out with casting compound, and having a housing which surrounds the component in cuboid fashion, whereby an open housing side is in communication with the further mounting space and is closed such by filling the casting compound that the switch chamber, after the casting, is closed both by the housing and, under given conditions, by the casting compound both toward the outside as well as from the further mounting chamber, being closed moisture-tight. The invention also relates to a method for sealing such a component.

2. Description of the Prior Art

German patent No. 29 01 077 discloses a sealing method for a relay whereby the contact chamber situated in the coil body is first pre-sealed by bonding on a two-layer coil. Subsequent thereto, this coil body is inserted into a cap as a whole and is cast out in this cap. A two-stage sealing is thus provided therein, whereby not only are additional work steps necessary but the overall volume of the relay is likewise increased due to the additional cap and the filling thereof with casting compound, since a tolerancing distance is present between the coil body serving as base body and the cap, being present at least at one or more sides and being filled out with casting compound.

German OS No. 33 18 518 likewise discloses a sealing method for a component wherein the component is also surrounded by a cap but whereby only the open connecting side is to be sealed with a layer of casting compound. For this purpose, it is proposed therein to glue a foil to the all round, lower edge of the housing cap and to fill casting compound in from above through a housing opening arranged siphon-like. Here, too, however, an additional cap over the base body is required, this, just like the siphon-like filling arrangement, requiring additional volume. This type of sealing is thus not applicable in every type of structure.

In components of this type, such as relays, at least one moisture-tight encapsulation is generally desired in order to prevent the penetration of rinse fluid and of solder agents into the contact chamber given flow-soldering of the component to a printed circuit board. A tight separation between the contact chamber and, particularly, the coil winding chamber is also desired in order, in addition to an improved isolation of the winding from the magnetic circuit parts, to particularly prevent the penetration of organic contaminants into the contact chamber, these deriving, for instance, from the wire insulation, and, moreover, in order to enable a better elimination of the coil heat to the outside.

SUMMARY OF THE INVENTION

An object of the invention is to provide an electromechanical component of the type described above and to provide a sealing method therefor, whereby the sealing between the switch chamber and the additional mounting chamber as well as toward the outside is achieved in a simple and space-saving way, whereby, in particular, an additionally pre-shaped housing, such as cap and pedestal, is not required.

This object is achieved in accord with the invention in that at least two of the closed housing sides positioned perpendicularly relative to one another are formed by a foil glued on to the base body and bent off over at least one edge, whereby the base body, potentially in combination with plugged-in function parts, forms the outside contours or, respectively, bending edges and also forms respectively all around seating surfaces for the foil in the edge regions of the switch chamber and of the mounting chamber.

Given the component of the invention, thus, a preformed housing manufacture, for example, in an involved ejection molding process and composed of cap and, under given conditions, pedestal is replaced by merely a simple and thin-walled foil which is merely planarly cut out and glued over the open housing sides of the base body. Significant volume is thereby saved, since not only is the wall thickness of such a foil significantly lower than that of a rigid cap but, as well, the clearances otherwise necessarily provided between the base body and a cap are eliminated. Nonetheless, the base body can initially comprise all necessary assembly openings, for example for inserting a coil winding, and for plugging in magnetic circuit parts and contact elements. This base body is merely formed such that the outside contours of the cuboid housing are present as a skeleton so that the initially planar foil provides the desired, cuboid housing contour when applied. It is thereby essentially adequate when at least the housing edges in the corner regions are prescribed by the base body and, when warranted, by additional function elements such as yoke or contact elements. Given longer edges, however, it is expedient when the foil is also at least partially supported between the corners. In some instances, it can even be expedient to provide a form-stable adaptor part as support for the foil in a housing region.

In order to guarantee a termination of the switching chamber toward the outside, the base body must continue to comprise all around seating surfaces for the foil as a through limitation of the switch chamber. All around seating surfaces for limiting the additional mounting chamber, for example a coil winding chamber, are likewise required so that the subsequently introduced casting compound flows only into the desired spaces.

Insofar as no housing apertures are required for the assembly of the function elements, of course, the base body can already include closed sides. Thus, for example, it is possible that two end faces of a relay housing in the form of a coil body are formed by closed walls of the base body, whereas an upper side and two longitudinal sides are closed by the adhesively applied foil. The last side, usually the connecting side with the solder pins, is usually employed as a filling opening for the casting compound, since the lead-throughs of the terminal pins can be sealed best and most easily in this way.

If necessary, however, up to five housing sides of a cuboid housing can be closed by the adhesively applied foil.

The foil itself can be fashioned as a two-layer or multi-layer foil, whereby the inside is formed by an adhesive or hot-melt glue or by some other adhesive compound. The adhesive layer can also be only partially applied, namely at the locations which later come into contact with the seating surfaces of the base body.

In the manufacture and sealing of the component of the invention, the function parts are first mounted in the pre-formed base body, a pre-cut foil is then placed on a side of the base body, is bent over the bending edges and is pressed against the base body on all sides; casting compound can be subsequently filled into the open housing side. Insofar as a hot-melt adhesive or a plastic melting under the influence of heat is employed for bonding, the overall component is heated before or, respectively, during the time the foil is pressed on.

BRIEF DESCRIPTION OF THE DRAWINGS

The invention shall be set forth in greater detail below with reference to exemplary embodiments shown in the drawings. Shown are:

FIG. 1 is a component in the form of a schematically illustrated relay including a foil to be glued on;

FIG. 5 is a further embodiment of a relay including a foil to be glued on.

DESCRIPTION OF THE PREFERRED EMBODIMENTS

Figure 1:
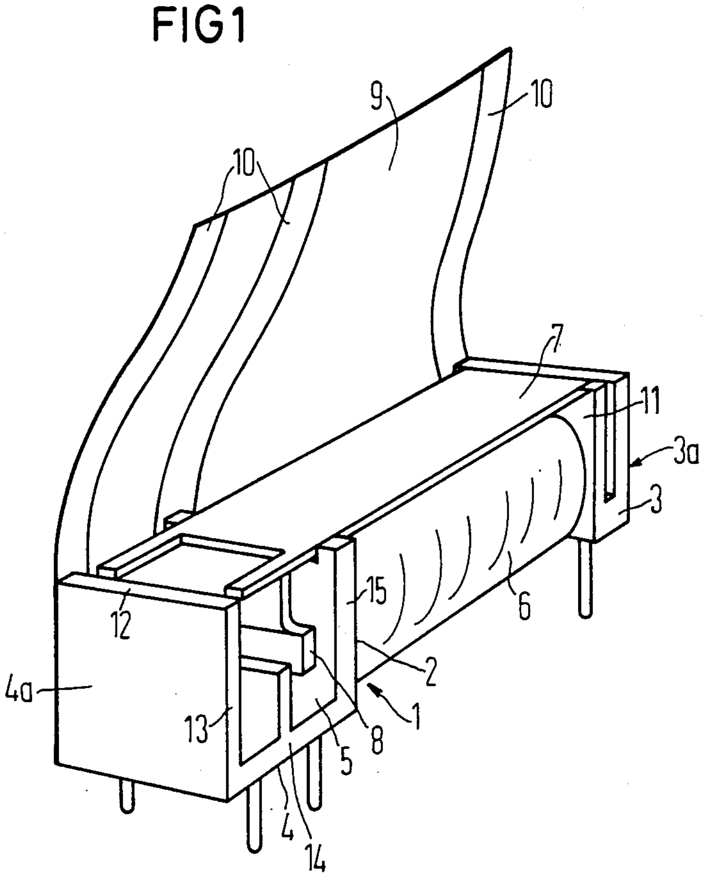

FIG. 1 schematically shows the base body of a relay in the form of a coil body 1 having two coil flanges 2 and 3 and a set-off 4 applied at the end face in front of the flange 2 for forming a switch and contact chamber 5. The coil body is provided with a winding 6; a yoke 7 is plugged over the winding and an armature 8 merely suggested is arranged in the switch chamber 5, this armature 8 actuating contact elements which are not shown.

An adhesive foil 9 is provided as housing termination, this being coated with adhesive webs 10 in the form of an adhesion glue or of a hot-melt glue and which is placed over the upper side as well as the two longitudinal sides of the relay and is glued thereto. The end faces 4*a* and 3*a* at the set-off 4 and at the coil flange 3 are already closed, so that no additional sealing is required. In order, however, to close the switch chamber 5 from a coil chamber 11 and from the outside, the base body 1 includes sealing surfaces proceeding at all sides, so that the the foil effects a through sealing over an upper surface 12, a lateral surface 13, a lower lateral surface 14 and a flange lateral surface 15, also over the upper side of the yoke 7 and the corresponding back surfaces at the flange 2 and the set-off 4. The foil is also glued over the upper side and over the lateral surfaces of the coil flange 3, so that the coil chamber 11 between the flanges 2 and 3 and the yoke 7 likewise forms a closed tub which can be filled toward the walls of the relay with casting compound proceeding from the underside.

Figure 2:
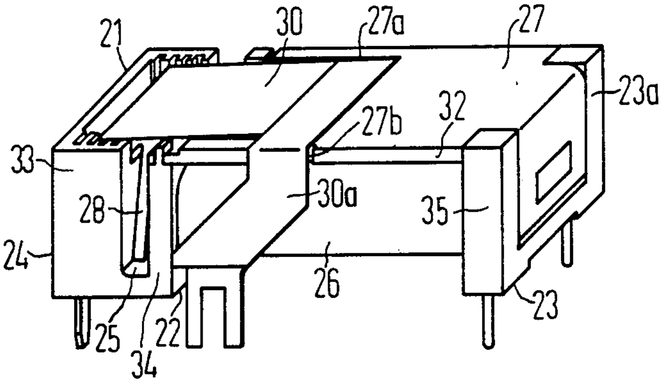
FIG. 2 is a base body of a relay with the mounted function elements.
Figure 3:
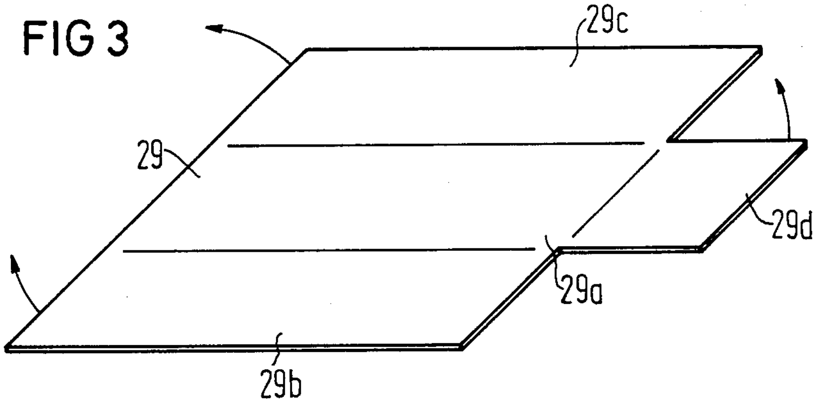
FIG. 3 is a foil to be applied to the relay of FIG. 2.
Figure 4:
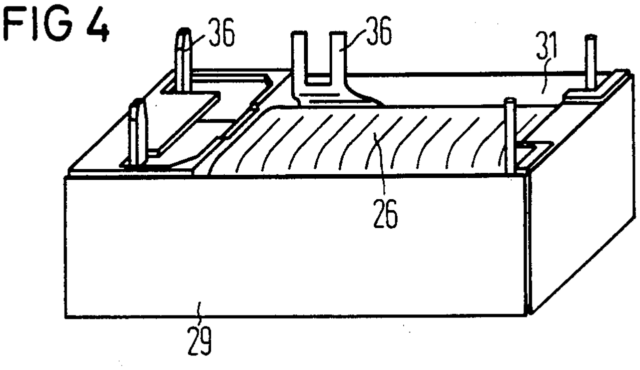
FIG. 4 is the relay of FIG. 2 after the foil has been applied.

FIG. 2 shows a somewhat different embodiment of a relay. In this case, a base body 21 includes two flanges 22 and 23 as well as a set-off 24 with a switch chamber 25. In this case, too, a yoke 27 is arranged over the winding, whereas an armature 28 is seated in the switch chamber. In this case, too, the base body 21 forms the contours for a cuboid housing on which a foil 29, shown in FIG. 3, is glued. Since a contact and bearing spring 30 for the armature is arranged at the upper side of the yoke 27, this yoke includes a depression 27*a* in the region of the spring 30 so that a planar seating and sealing surface for the foil is guaranteed. The yoke also includes a recess 27*b* in the region of a lateral continuation 30*a* of the contact spring 30 in order to likewise make lateral face 32 of the yoke flush with the lateral faces 33, 34 and 35 of the base body. For sealing, the base body is turned over first with the upper side of the yoke 27 placed on a center section 29*a* of the foil 29 shown in FIG. 3. Lateral tabs 29*b* and 29*c* are subsequently turned up in the arrow direction and are placed over the longitudinal sides of the relay. Finally, a front tab 29*d* of the foil is placed over an end face 23*a* at the coil flange 23 and is glued on. A relay having a housing as illustrated in FIG. 4 closed at five sides thus derives, its terminal pins 36 pointing up. Only a coil chamber 31 is open toward the outside so that it can be closed in an otherwise standard way by filling in casting compound.

Figure 5:
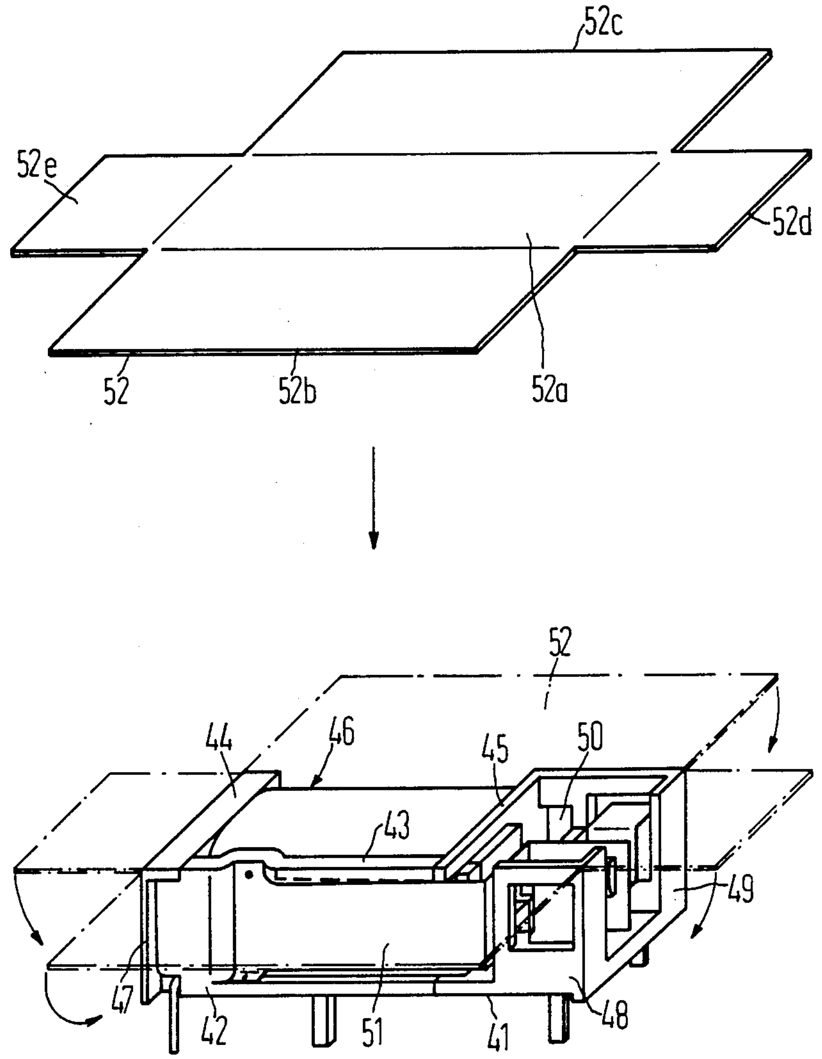

FIG. 5 shows a further exemplary embodiment of an inventively fashioned relay. A base body 41 contains the functional parts already set forth above, so they are not described in greater detail here. Only a yoke 42 is pointed out, its upper narrow side 43 together with upper surfaces 44 and 45 of the coil flange and together with the back terminating surfaces (not visible) forming a limitation of a winding chamber 46 which proceeds on all sides. Lateral surfaces 47, 48 and 49 visible at the front side augmenting corresponding, all around sealing surface for a switch chamber 50 which also surrounds a spring 51 placed laterally onto the yoke. In this case, too, a foil 52 is employed as termination for the base body, this foil 52 having both its center part 52*a* placed over the upper side of the relay as well as having four lateral tabs 52*b*, 52*c*, 52*d* and 52*e* placed over the four lateral surfaces of the base body 41.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

I claim as our invention:

1. An electromechanical component, having a base body which includes at least one switch chamber containing movable parts and at least one further mounting chamber containing stationary parts and filled with casting compound, and having a housing which surrounds the component in cuboid fashion, whereby an open housing side is in communication with the further mounting chamber and is closed by filling the casting compound in such that, after the casting, the switch chamber is closed fluid-tight both from the outside as well as from the further mounting chamber, said mounting chamber being closed by the housing and the casting compound, comprising the improvement wherein at least two of the closed housing sides positioned perpendicular to one another are formed by a foil glued onto the base body and bent off over at least one edge, whereby the base body forms bending edges as well as all around seating surfaces for the foil in the edge regions of at least one of the switch chamber and the mounting chamber.

2. A component according to claim 1, wherein two faces of the housing are formed by closed walls of the base body and in that three other housing sides are formed by said foil.

3. A component according to claim 1, wherein at least four housing sides are formed by the foil.

4. A component according to claim 1, wherein a yoke leg forms at least one of bending edges for the foil and sealing surfaces relative to the switch chamber.

5. A component according to claim 1, wherein the foil is coated with a glue material, being coated therewith at least in those regions lying against at least one of the base body and the function elements.

6. A component according to claim 1, wherein a part of the housing contours are formed by an additional, form-stable adaptor part inserted between said base body and foil.

7. A component according to claim 5, wherein said glue material is an adhesion glue.

8. A component according to claim 5, wherein said glue material is a hot-melt glue.

* * * * *